(12) United States Patent
Minzoni

(10) Patent No.: US 7,403,055 B2
(45) Date of Patent: Jul. 22, 2008

(54) DUTY CYCLE DETECTOR WITH FIRST AND SECOND OSCILLATING SIGNALS

(75) Inventor: Alessandro Minzoni, Morrisville, NC (US)

(73) Assignee: Infineon Technologies AG, Munich (DE)

( * ) Notice: Subject to any disclaimer, the term of this patent is extended or adjusted under 35 U.S.C. 154(b) by 182 days.

(21) Appl. No.: 11/217,086

(22) Filed: Aug. 31, 2005

(65) Prior Publication Data
US 2007/0047375 A1   Mar. 1, 2007

(51) Int. Cl.
*H03K 3/017* (2006.01)
(52) U.S. Cl. .................................. 327/175; 327/172
(58) Field of Classification Search ............... 327/172, 327/175
See application file for complete search history.

(56) References Cited

U.S. PATENT DOCUMENTS

| | | | |
|---|---|---|---|
| 4,475,086 A | 10/1984 | Allen | |
| 5,614,855 A | 3/1997 | Lee et al. | |
| 5,945,857 A | 8/1999 | Havens | |
| 6,320,438 B1 | 11/2001 | Arcus | |
| 6,452,432 B2 | 9/2002 | Kim | |
| 6,603,337 B2 * | 8/2003 | Cho | 327/149 |
| 6,765,421 B2 | 7/2004 | Brox et al. | |
| 6,781,419 B2 | 8/2004 | Harrison | |
| 6,943,604 B2 * | 9/2005 | Minzoni | 327/175 |
| 2002/0140477 A1 | 10/2002 | Zhou et al. | |
| 2004/0075462 A1 | 4/2004 | Kizer et al. | |
| 2004/0189364 A1 | 9/2004 | Lee et al. | |

\* cited by examiner

*Primary Examiner*—Kenneth B. Wells
(74) *Attorney, Agent, or Firm*—Dicke, Billig & Czaja, PLLC

(57) ABSTRACT

A duty cycle detector including a first circuit, a second circuit, and a third circuit. The first circuit is configured to receive a clock signal having a first duty cycle and to provide a first oscillating signal having a first period proportional to the first duty cycle. The second circuit is configured to receive an inverted clock signal that is the inverse of the clock signal and having a second duty cycle and to provide a second oscillating signal having a second period proportional to the second duty cycle. The third circuit is configured to provide first output signals that indicate the first duty cycle of the clock signal based on a first phase difference between the first oscillating signal and the second oscillating signal.

33 Claims, 4 Drawing Sheets

DUTY CYCLE DETECTOR WITH FIRST AND SECOND OSCILLATING SIGNALS

BACKGROUND

Typically, a computer system includes a number of integrated circuit chips that communicate with one another to perform system applications. As chip speeds increase, the amount of data communicated between chips increases to meet the demands of some system applications. Often, the computer system includes a controller, such as a micro-processor, and one or more memory chips, such as random access memory (RAM) chips. The RAM chips can be any suitable type of RAM, such as dynamic RAM (DRAM), double data rate synchronous DRAM (DDR-SDRAM), graphics DDR-SDRAM (GDDR-SDRAM), reduced latency DRAM (RLDRAM), pseudo static RAM (PSRAM), and low power DDR-SDRAM (LPDDR-SDRAM).

Many of the integrated circuit chips, such as the memory chips, receive a clock signal to operate. In a memory chip operating at high frequencies, it is important to have a clock signal that has about a 50% duty cycle. This provides the memory with approximately an equal amount of time on the high level phase and the low level phase of a clock cycle for transferring data, such as latching rising edge data and latching falling edge data, into and out of the memory.

Typically, a clock signal is provided by an oscillator, such as a crystal oscillator, and clock circuitry. The oscillator and clock circuitry often provide a clock signal that does not have a 50% duty cycle. For example, the clock signal may have a 45% duty cycle, where the high level phase is 45% of one clock cycle and the low level phase is the remaining 55% of the clock cycle. To correct or change the duty cycle of the clock signal, a duty cycle detector can indicate the duty cycle of the clock signal and the output of the duty cycle detector can be provided to the clock circuitry that corrects the clock signal to have about a 50% duty cycle.

Duty cycle detectors are usually either analog duty cycle detectors or digital duty cycle detectors. Analog duty cycle detectors often require big design efforts and even in power saving mode an analog duty cycle detector consumes power. Digital duty cycle detectors often include fine delay units that are difficult to build and complex control circuitry.

For these and other reasons there is a need for the present invention.

SUMMARY

One aspect of the present invention provides a duty cycle detector including a first circuit, a second circuit, and a third circuit. The first circuit is configured to receive a clock signal having a first duty cycle and to provide a first oscillating signal having a first period proportional to the first duty cycle. The second circuit is configured to receive an inverted clock signal that is the inverse of the clock signal and having a second duty cycle and to provide a second oscillating signal having a second period proportional to the second duty cycle. The third circuit is configured to provide first output signals that indicate the first duty cycle of the clock signal based on a first phase difference between the first oscillating signal and the second oscillating signal.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the, present invention. The following detailed description, therefore, is not to be taken in a limiting sense, and the scope of the present invention is defined by the appended claims.

Figure 1:
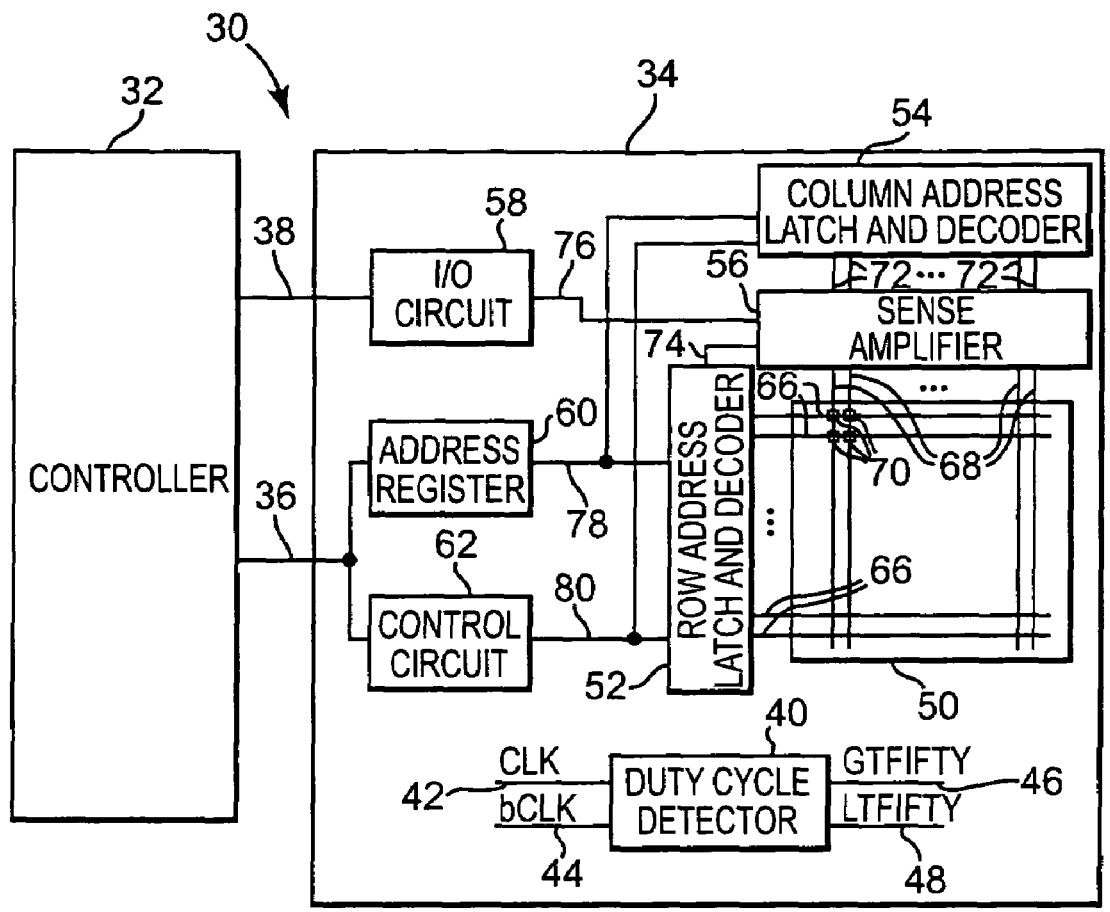
FIG. 1 is a block diagram illustrating one embodiment of a computer system according to the present invention.

FIG. 1 is a block diagram illustrating one embodiment of a computer system 30 according to the present invention. Computer system 30 includes a controller 32 and a RAM 34. Controller 32 is electrically coupled to RAM 34 via memory communications path 36 and data communications path 38. Controller 32 provides row and column addresses and control signals to RAM 34 via memory communications path 36. Controller 32 provides data and strobe signals to RAM 34 and receives data and strobe signals from RAM 34 via data communications path 38. RAM 34 can be any suitable type of RAM, such as a DRAM, DDR-SDRAM, GDDR-SDRAM, RLDRAM, PSRAM, and a LPDDR-SDRAM.

RAM 34 includes a duty cycle detector 40 that receives clock signal CLK at 42 and inverted clock signal bCLK at 44 and provides duty cycle output signals GTFIFTY at 46 and LTFIFTY at 48. Duty cycle detector 40 provides oscillating signals that have oscillating signal periods proportional to the duty cycles of clock signal CLK at 42 and inverted clock signal bCLK at 44. One oscillating signal has a period proportional to the duty cycle of clock signal CLK at 42 and another oscillating signal has a period proportional to the duty cycle of inverted clock signal bCLK at 44. Output signals GTFIFTY at 46 and LTFIFTY at 48 indicate the duty cycle of clock signal CLK at 42 based on the phase difference of the oscillating signals.

Inverted clock signal bCLK at 44 is the inverse of clock signal CLK at 42. The duty cycle of clock signal CLK at 42 is the high level phase time of clock signal CLK at 42 divided by the period of clock signal CLK at 42. The duty cycle of inverted clock signal bCLK at 44 is the high level phase time of inverted clock signal bCLK divided by the period of the inverted clock signal bCLK at 44. Thus, clock signal CLK at 42 may have a 45% duty cycle and inverted clock signal bCLK at 44 a corresponding 55% duty cycle.

Clock signal CLK at 42 and inverted clock signal bCLK at 44 are provided via any suitable clock circuit. In one embodiment, clock signal CLK at 42 and inverted clock signal bCLK at 44 are provided via an oscillator, such as a crystal oscillator, and internal clock circuitry in RAM 34. In one embodiment, clock signal CLK at 42 and inverted clock signal bCLK at 44 are provided via an external clock circuit, such as a stand alone clock circuit or controller 32.

Output signal GTFIFTY at 46 indicates that the duty cycle of clock signal CLK at 42 is greater than 50% and output signal LTFIFTY at 48 indicates that the duty cycle of clock signal CLK at 42 is less than 50%. In one embodiment, internal clock circuitry in RAM 34 receives clock signal CLK at 42 and inverted clock signal bCLK at 44 and output signals GTFIFTY at 46 and LTFIFTY at 48 and provides internal clock signals in RAM 34 that have about a 50% duty cycle. These internal clock signals are used to provide approximately an equal amount of time on the high level phase and the low level phase of a clock cycle for transferring data, such as latching rising edge data and latching falling edge data, into and out of RAM 34. In one embodiment, output signals GTFIFTY at 46 and LTFIFTY at 48 are provided to the external clock circuit that provides clock signal CLK at 42 and inverted clock signal bCLK at 44 and the external clock circuit changes the duty cycle of clock signal CLK at 42 and inverted clock signal bCLK at 44 to be about 50% based on output signals GTFIFTY at 46 and LTFIFTY at 48. In other embodiments, duty cycle detector 40 can be employed in any suitable integrated circuit.

RAM 34 also includes an array of memory cells 50, a row address latch and decoder 52, a column address latch and decoder 54, a sense amplifier circuit 56, a RAM I/O circuit 58, an address register 60, and a control circuit 62. Conductive word lines 66, referred to as row select lines, extend in the x-direction across the array of memory cells 50. Conductive bit lines 68, referred to as digit lines, extend in the y-direction across the array of memory cells 50. A memory cell 70 is located at each cross point of a word line 66 and a bit line 68.

Each word line 66 is electrically coupled to row address latch and decoder 52 and each bit line 68 is electrically coupled to one of the sense amplifiers in sense amplifier circuit 56. The sense amplifier circuit 56 is electrically coupled to column address latch and decoder 54 via conductive column select lines 72. Also, sense amplifier circuit 56 is electrically coupled to row address latch and decoder 52 via communications path 74 and to RAM I/O circuit 58 via I/O communications path 76. Data is transferred between RAM I/O circuit 58 and controller 32 via data communications path 38.

Controller 32 is electrically coupled to address register 60 and control circuit 62 via memory communications' path 36. Address register 60 is electrically coupled to row address latch and decoder 52 and column address latch and decoder 54 via row and column address lines 78. Control circuit 62 is electrically coupled to row address latch and decoder 52 and column address latch and decoder 54 via control communications path 80.

Duty cycle detector 40 receives clock signal CLK at 42 and inverted clock signal bCLK at 44 and provides oscillating signals that have oscillating signal periods proportional to the duty cycles of clock signal CLK at 42 and inverted clock signal bCLK at 44. At least one oscillating signal has a period proportional to the duty cycle of clock signal CLK at 42 and at least one oscillating signal has a period proportional to the duty cycle of inverted clock signal bCLK at 44. Duty cycle detector 40 detects a phase difference between oscillating signals and provides output signals GTFIFTY at 46 and LTFIFTY at 48 that indicate the duty cycle of clock signal CLK at 42.

Address register 60 receives row and column addresses from controller 32 via memory communications path 36. Address register 60 supplies a row address to row address latch and decoder 52 via row and column address lines 78, and control circuit 62 supplies a RAS signal to row address latch and decoder 52 via control communications path 80 to latch the supplied row address into row address latch and decoder 52. Address register 60 supplies a column address to column address latch and decoder 54 via row and column address lines 78, and control circuit 62 supplies a CAS signal to column address latch and decoder 54 via control communications path 80 to latch the supplied column address into column address latch and decoder 54.

Controller 32 and I/O circuit 58 communicate data between controller 32 and RAM 34 via data communications path 38. I/O circuit 58 includes a suitable number of transmitter and receiver pairs and controller 32 includes a suitable number of transmitter and receiver pairs. Each transmitter and receiver pair in I/O circuit 58 corresponds to a transmitter and receiver pair in controller 32. Data communications path 38 includes one or more signal lines and each transmitter and receiver pair in I/O circuit 58 is electrically coupled to the corresponding transmitter and receiver pair in controller 32 via one of the signal lines in data communications path 38.

Sense amplifier circuit 56 includes sense amplifiers, equalization and precharge circuits, and switches. The sense amplifiers are differential input sense amplifiers and each sense amplifier receives one bit line 68 at each of the two differential inputs. One of the bit lines 68 receives a data bit from a selected memory cell 70 and the other bit line 68 is used as a reference. The equalization and precharge circuits equalize the voltage on bit lines 68 connected to the same sense amplifier prior to a read or write operation.

To read a data bit, a sense amplifier amplifies the difference between the data bit value and the reference value and provides a sensed output value to I/O circuit 58 via I/O communications path 76. I/O circuit 58 receives the sensed output value and outputs data and strobe signals based on internal clock signals that have a duty cycle of about 50% via duty cycle detector 40 and output signals GTFIFTY at 46 and LTFIFTY at 48. One of the transmitter and receiver pairs in I/O circuit 58 provides the sensed output value to the corresponding transmitter and receiver pair in controller 32 via data communications path 38.

To write a data bit, one of the transmitter and receiver pairs in controller 32 provides a data bit to the corresponding transmitter and receiver pair in I/O circuit 58 via data communications path 38. I/O circuit 58 provides the data bit to a sense amplifier in sense amplifier circuit 56 via I/O communications path 76. I/O circuit 58 overdrives the sense amplifier to overdrive the data bit value onto the bit line 68 that is connected to one of the memory cells 70 and to overdrive the inverse of the data bit value onto the reference bit line 68. The sense amplifier writes the received data bit value into the selected memory cell 70.

Row address latch and decoder 52 receives row addresses and RAS signals and latches the row addresses into row address latch and decoder 52. Row address latch and decoder 52 decodes each of the row addresses to select a row of memory cells 70. Also, row address latch and decoder 52 provides sense amplifier activation signals and equalization and precharge signals to sense amplifier circuit 56 via communications path 74.

Column address latch and decoder 54 activates column select lines 72 to connect sense amplifiers in sense amplifier circuit 56 to transmitter and receiver pairs in I/O circuit 58. Column address latch and decoder 54 receives a column address and latches the column address into column address latch and decoder 54. Column address latch and decoder 54 decodes the column address to select addressed column select lines 72. In addition, column address latch and decoder 54 receives column select line activation signals from control circuit 62 via control communications path 80. The column select line activation signals indicate which of the addressed column select lines 72 are to be activated by column address latch and decoder 54. Column address latch and decoder 54 activates column select lines 72 that are addressed by the column address and selected for activation by the column select line activation signals. Activated column select lines 72 are provided to sense amplifier circuit 56 to connect sense amplifiers in sense amplifier circuit 56 to circuitry in I/O circuit 58.

Controller 32 provides addresses and control signals to control circuit 62 via memory communications path 36. Control circuit 62 receives the addresses and control signals from controller 32 and provides internal control signals to read data from or write data into the array of memory cells 50. Control circuit 62 provides RAS signals to row address latch and decoder 52 and CAS signals to column address latch and decoder 54. Also, control circuit 62 provides internal control signals to column address latch and decoder 52 to selectively activate column select lines 72. In one embodiment, RAM 34 is a PSRAM and controller 32 provides SRAM control signals to control circuit 62. The SRAM control signals do not include DRAM control signals, such as RAS and CAS signals, and control circuit 62 provides the DRAM control signals in response to the SRAM control signals.

During a read operation, control circuit 62 receives read control signals and address register 60 receives the row address of a selected memory cell or cells 70. The row address is supplied from address register 60 to row address latch and decoder 52 and latched into row address latch and decoder 52 by control circuit 62 that provides a RAS signal. Row address latch and decoder 52 decodes the row address and activates the selected word line 66. As the selected word line 66 is activated, the value stored in each memory cell 70 coupled to the selected word line 66 is passed to the respective bit line 68. The bit value stored at a memory cell 70 is detected by a sense amplifier that is electrically coupled to the respective bit line 68.

Next, control circuit 62 and address register 60 receive the column address of the selected memory cell or cells 70. The column address is supplied from address register 60 to column address latch and decoder 54 and latched into column address latch and decoder 54 by control circuit 62 that provides a CAS signal. The column address latch and decoder 54 decodes the column address to select column select lines 72. Control circuit 62 provides internal control signals to column address latch and decoder 54 to selectively activate column select lines 72 and connect selected sense amplifiers to output circuitry in I/O circuit 58. I/O circuit 58 receives sensed output values and outputs data and strobe signals based on internal clock signals that have a duty cycle of about 50% via duty cycle detector 40 and output signals GTFIFTY at 46 and LTFIFTY at 48. The sensed output values are provided to transmitter and receiver pairs in I/O circuit 58 and to the corresponding transmitter and receiver pairs in controller 32 via data communications path 38.

During a write operation, data to be stored in the array of memory cells 50 is supplied from transmitter and receiver pairs in controller 32 to transmitter and receiver pairs in I/O circuit 58 via data communications path 38. Control circuit 62 receives write control signals and address register 60 receives the row address of a selected memory cell or cells 70. The row address is supplied from address register 60 to row address latch and decoder 52 and latched into row address latch and decoder 52 by control circuit 62 that provides a RAS signal. The row address latch and decoder 52 decodes the row address and activates the selected word line 66. As the selected word line 66 is activated, the value stored in each memory cell 70 coupled to the selected word line 66 is passed to the respective bit line 68 and the sense amplifier that is electrically coupled to the respective bit line 68.

Next, control circuit 62 and address register 60 receive the column address of the selected memory cell or cells 70. Address register 60 supplies the column address to column address latch and decoder 54 and the column address is latched into column address latch and decoder 54 by control circuit 62 via a CAS signal. Column address latch and decoder 54 receives column select line activation signals from control circuit 62 and activates selected column select lines 72 to connect sense amplifiers in sense amplifier circuit 56 to transmitter and receiver pairs in I/O circuit 58. I/O circuit 58 passes data from controller 32 to the sense amplifiers and overdrives the sense amplifiers to write data to the selected memory cell or cells 70 via bit lines 68.

Figure 2:
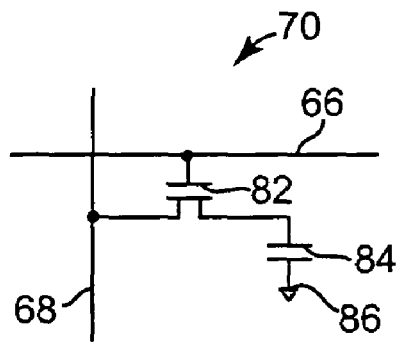
FIG. 2 is a diagram illustrating one embodiment of a random access memory cell in the array of memory cells.

FIG. 2 is a diagram illustrating one embodiment of a random access memory cell 70 in the array of memory cells 50. Memory cell 70 includes a transistor 82 and a capacitor 84. The gate of transistor 82 is electrically coupled to word line 66. One side of the drain-source path of transistor 82 is electrically coupled to bit line 68 and the other side of the drain-source path is electrically coupled to one side of capacitor 84. The other side of capacitor 84 is electrically coupled to a reference 86, such as one-half the supply voltage. Capacitor 84 is charged and discharged to represent logic 0 or logic 1.

During a read operation, a high voltage level is provided on word line 66 to turn on transistor 82. The data bit value stored on capacitor 84 is read by a sense amplifier via bit line 68. During a write operation, a high voltage level is provided on word line 66 to turn on transistor 82 and access capacitor 84. The sense amplifier connected to bit line 68 is overdriven to write a data bit value on capacitor 84 via bit line 68 and transistor 82.

A read operation on memory cell 70 is a destructive read operation. After each read operation, capacitor 84 is recharged or discharged to the data bit value that was just read. In addition, even without read operations, the charge on capacitor 84 discharges over time. To retain a stored data bit value, memory cell 70 is refreshed periodically by reading and/or writing memory cell 70. All memory cells 70 in the array of memory cells 50 are periodically refreshed to maintain their data bit values.

Figures 3, 4:
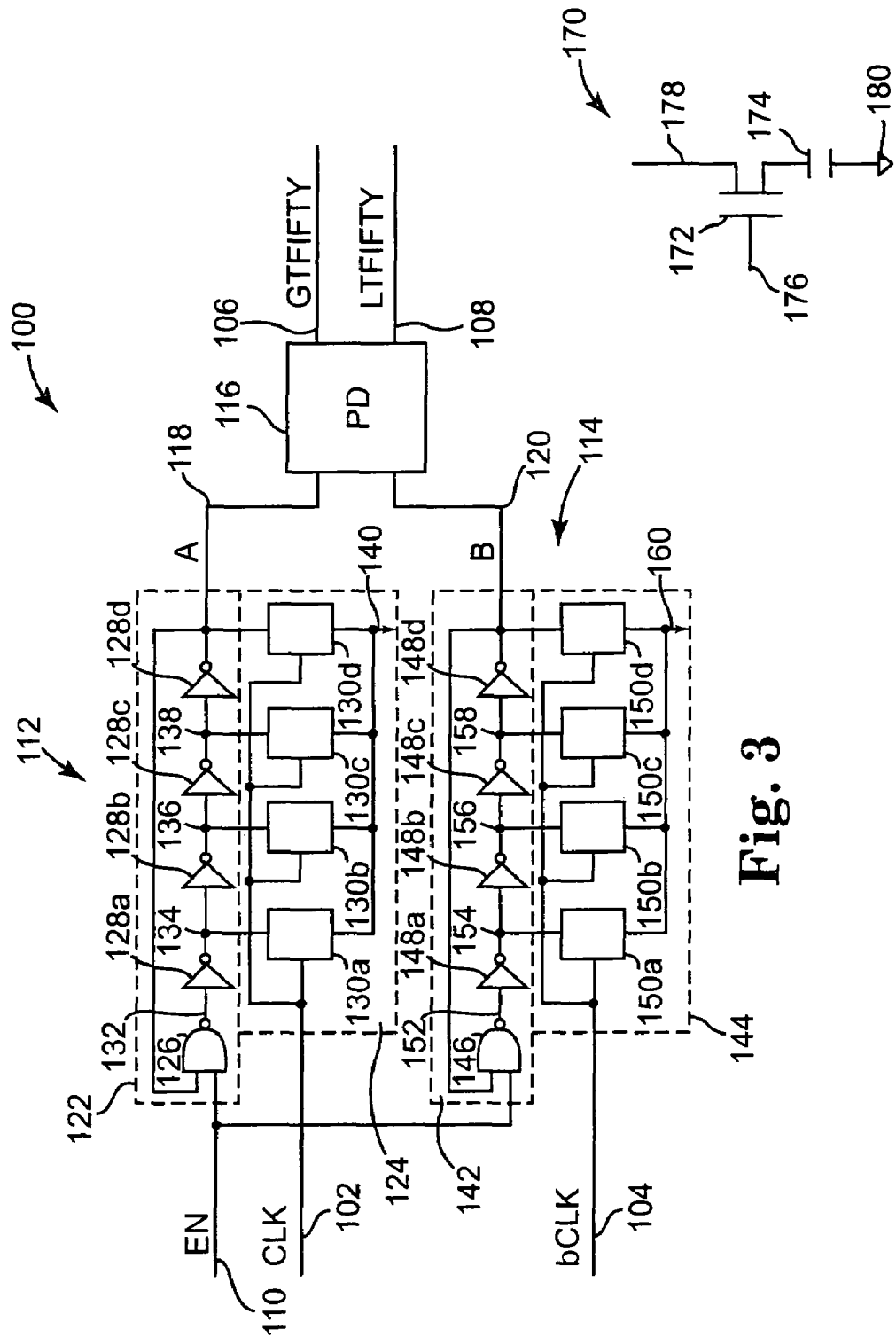
FIG. 3 is a diagram illustrating one embodiment of a duty cycle detector.
FIG. 4 is a diagram illustrating one embodiment of a delay element.

FIG. 3 is a diagram illustrating one embodiment of a duty cycle detector 100. Duty cycle detector 100 receives clock signal CLK at 102 and inverted clock signal bCLK at 104 and provides output signals GTFIFTY at 106 and LTFIFTY at 108. Also, duty cycle detector 100 receives enable signal EN at 110. Duty cycle detector 100 is similar to duty cycle detector 40. Also, clock signal CLK at 102 and inverted clock signal bCLK at 104 are similar to clock signal CLK at 42 and inverted clock signal bCLK at 44, respectively. In addition, output signals GTFIFTY at 106 and LTFIFTY at 108 are similar to output signals GTFIFTY at 46 and LTFIFTY at 48, respectively.

Inverted clock signal bCLK at 104 is the inverse of clock signal CLK at 102. The duty cycle of clock signal CLK at 102 is the high level phase time of clock signal CLK at 102 divided by the period of clock signal CLK at 102. The duty cycle of inverted clock signal bCLK at 104 is the high level phase time of inverted clock signal bCLK divided by the period of the inverted clock signal bCLK at 104. Clock signal CLK at 102 and inverted clock signal bCLK at 104 are provided via any suitable clock circuit. Output signal GTFIFTY at 106 indicates that the duty cycle of clock signal CLK at 102 is greater than 50% and output signal LTFIFTY at 108 indicates that the duty cycle of clock signal CLK at 102 is less than 50%. Enable signal EN at 110 is activated to begin detecting the duty cycle of clock signal CLK at 102.

Duty cycle detector 100 includes a first oscillating circuit 112, a second oscillating circuit 114, and a phase detector circuit (PD) 116. First oscillating circuit 112 is electrically coupled to phase detector circuit 116 via oscillating signal path 118. First oscillating circuit 112 receives clock signal CLK at 102 and enable signal EN at 110 and provides oscillating signal A at 118 to phase detector circuit 116 via oscillating signal path 118. Oscillating signal A at 118 has an oscillating signal period that is proportional to the duty cycle of clock signal CLK at 102. Second oscillating circuit 114 is electrically coupled to phase detector circuit 116 via oscillating signal path 120. Second oscillating circuit 114 receives inverted clock signal bCLK at 104 and enable signal EN at 110 and provides oscillating signal B at 120 to phase detector circuit 116 via oscillating signal path 120. Oscillating signal B at 120 has an oscillating signal period that is proportional to the duty cycle of inverted clock signal bCLK at 104.

Phase detector circuit 116 receives oscillating signal A at 118 and oscillating signal B at 120 and provides output signals GTFIFTY at 106 and LTFIFTY at 108. Phase detector circuit 116 detects the phase difference between oscillating signal A at 118 and oscillating signal B at 120. If the phase difference reaches a phase difference limit, phase detector circuit 116 indicates the duty cycle of clock signal CLK at 102. Phase detector circuit 116 indicates that the duty cycle is greater than 50% via output signal GTFIFTY at 106 and less than 50% via output signal LTFIFTY at 108. In one embodiment, phase detector circuit 116 receives an active enable signal EN at 110 and waits a viable number of clock cycles of clock signal CLK at 102 before indicating the duty cycle of clock signal clock at 102.

First oscillating circuit 112 includes a first ring oscillator 122 and a first delay circuit 124. First ring oscillator 122 receives enable signal EN at 110 and provides oscillating signal A at 118. First delay circuit 124 receives clock signal CLK at 102 and provides delays that are switched into first ring oscillator 122 via clock signal CLK at 102. The period of oscillating signal A at 118 is affected by the delays to be proportional to the duty cycle of clock signal CLK at 102. In one embodiment, delays are switched into first ring oscillator 122 via the high phase of clock signal CLK at 102 and switched out during the low phase of clock signal CLK at 102. In one embodiment, delays are switched into first ring oscillator 122 via the low phase of clock signal CLK at 102 and switched out during the high phase of clock signal CLK at 102.

First ring oscillator 122 includes a first NAND gate 126, a first inverter 128a, a second inverter 128b, a third inverter 128c, and a fourth inverter 128d. First delay circuit 124 includes a first delay element 130a, a second delay element 130b, a third delay element 130c, and a fourth delay element 130d. The output of first NAND gate 126 is electrically coupled to the input of first inverter 128a via inverter signal path 132. The output of first inverter 128a is electrically coupled to the input of second inverter 128b and first delay element 130a via inverter signal path 134. The output of second inverter 128b is electrically coupled to the input of third inverter 128c and second delay element 130b via inverter signal path 136. The output of third inverter 128c is electrically coupled to the input of fourth inverter 128d and third delay element 130c via inverter signal path 138. The output of fourth inverter 128d is electrically coupled to one input of NAND gate 126, fourth delay element 130d, and phase detector circuit 116 via oscillating signal path 118. The other input of NAND gate 126 receives enable signal EN at 110. Each of the delay elements 130a-130d receive clock signal CLK at 102 and each of the delay elements 130a-130d are electrically coupled to a reference, such as ground, at 140.

Second oscillating circuit 114 includes a second ring oscillator 142 and a second delay circuit 144. Second ring oscillator 142 receives enable signal EN at 110 and provides oscillating signal B at 120. Second delay circuit 144 receives inverted clock signal bCLK at 104 and provides delays that are switched into second ring oscillator 142 via inverted clock signal bCLK at 104. The period of oscillating signal B at 120 is affected by the delays to be proportional to the duty cycle of inverted clock signal bCLK at 104. In one embodiment, delays are switched into second ring oscillator 142 via the high phase of inverted clock signal bCLK at 104 and switched out during the low phase of inverted clock signal bCLK at 104. In one embodiment, delays are switched into second ring oscillator 142 via the low phase of inverted clock signal bCLK at 104 and switched out during the high phase of inverted clock signal bCLK at 104.

Second ring oscillator 142 includes a second NAND gate 146, a fifth inverter 148a, a sixth inverter 148b, a seventh inverter 148c, and an eighth inverter 148d. Second delay circuit 144 includes a fifth delay element 150a, a sixth delay element 150b, a seventh delay element 150c, and an eighth delay element 150d. The output of second NAND gate 146 is electrically coupled to the input of fifth inverter 148a via inverter signal path 152. The output of fifth inverter 148a is electrically coupled to the input of sixth inverter 148b and fifth delay element 150a via inverter signal path 154. The output of sixth inverter 148b is electrically coupled to the input of seventh inverter 148c and sixth delay element 150b via inverter signal path 156. The output of seventh inverter 128c is electrically coupled to the input of eighth inverter 148d and seventh delay element 150c via inverter signal path 158. The output of eighth inverter 148d is electrically coupled to one input of NAND gate 146, eighth delay element 150d, and phase detector circuit 116 via oscillating signal path 120. The other input of NAND gate 146 receives enable signal EN at 110. Each of the delay elements 150a-150d receives inverted clock signal bCLK at 104 and each of the delay elements 150a-150d are electrically coupled to a reference, such as ground, at 160.

In operation, if enable signal EN at 110 is at a low logic level, NAND gate 126 provides a high logic level output signal, first inverter 128a provides a low logic level, second inverter 128b provides a high logic level, third inverter 128c provides a low logic level, and fourth inverter 128d provides a high logic level output signal in signal A at 118 to the input of NAND gate 126. Also, NAND gate 146 provides a high logic level output signal, fifth inverter 148a provides a low logic level, sixth inverter 148b provides a high logic level, seventh inverter 148c provides a low logic level, and eighth inverter 148d provides a high logic level output signal in signal B at 120 to the input of NAND gate 146.

Clock signal CLK at 102 provides an oscillating clock signal that has a duty cycle, which is the high phase of clock signal CLK at 102 divided by the period of clock signal CLK at 102. Inverted clock signal bCLK at 104 is the inverse of clock signal CLK at 102. The duty cycle of inverted clock signal bCLK at 104 is the high phase of inverted clock signal bCLK at 104, i.e., the low phase of clock signal CLK at 102, divided by the period of inverted clock signal bCLk at 104, i.e., the period of clock signal CLK at 102. The duty cycle of clock signal CLK at 102 plus the duty cycle of inverted clock signal bCLK at 104 is equal to 100%.

As enable signal EN at 110 transitions to an active high logic level, NAND gate 126 transitions to a low logic level output signal in the inverter signal path of first ring oscillator 122. First inverter 128a provides a high logic level, second inverter 128b provides a low logic level, third inverter 128c provides a high logic level, and fourth inverter 128d outputs a low logic level in oscillating signal A at 118 to the input of NAND gate 126, which transitions back to a high logic level. First ring oscillator 122 provides an oscillating signal in oscillating signal A at 118 to phase detector 116. Also, NAND gate 146 transitions to a low logic level output signal in the inverter signal path of second ring oscillator 142. Fifth inverter 148a provides a high logic level, sixth inverter 148b provides a low logic level, seventh inverter 148c provides a high logic level, and eighth inverter 148d outputs a low logic level in oscillating signal B at 120 to the input of NAND gate 146, which transitions back to a high logic level. Second ring oscillator 142 provides an oscillating signal in oscillating signal B at 120 to phase detector 116.

Delay circuit 124 provides delays in the inverter signal path of inverters 128a-128d based on the duty cycle of clock signal CLK at 102 and delay circuit 144 provides delays in the inverter signal path of inverters 148a-148d based on the duty cycle of inverted clock signal bCLK at 104. First delay element 130a provides a delay at 134 at the output of first inverter 128a. Second delay element 130b provides a delay at 136 at the output of second inverter 128b. Third delay element 130c provides a delay at 138 at the output of third inverter 128c. Fourth delay element 130d provides a delay at 118 at the output of fourth inverter 128d. Fifth delay element 150a provides a delay at 154 at the output of fifth inverter 148a. Sixth delay element 150b provides a delay at 15.6 at the output of sixth inverter 148b. Seventh delay element 150c provides a delay at 158 at the output of seventh inverter 148c. Eighth delay element 150d provides a delay at 120 at the output of eighth inverter 148d.

Delays from delay elements 130a-130d increase the period of oscillating signal A at 118 and delays from delay elements 150a-150d increase the period of oscillating signal B at 120. In one embodiment, delays from delay elements 130a-130d are switched into first ring oscillator 122 via the high phase of clock signal CLK at 102 and switched out during the low phase of clock signal CLK at 102, and delays from delay elements 150a-150d are switched into second ring oscillator 142 via the high phase of inverted clock signal bCLK at 104 and switched out during the low phase of inverted clock signal bCLK at 104. In this embodiment, if the duty cycle of clock signal CLK at 102 is larger than the duty cycle of inverted clock signal bCLK at 104, the period of oscillating signal A at 118 grows longer than the period of oscillating signal B at 120, and if the duty cycle of clock signal CLK at 102 is smaller than the duty cycle of inverted clock signal bCLK at 104, the period of oscillating signal B at 120 grows longer than the period of oscillating signal A at 118.

In one embodiment, delays from delay elements 130a-130d are switched into first ring oscillator 122 via the low phase of clock signal CLK at 102 and switched out during the high phase of clock signal CLK at 102, and delays from delay elements 150a-150d are switched into second ring oscillator 142 via the low phase of inverted clock signal bCLK at 104 and switched out during the high phase of inverted clock signal bCLK at 104. In this embodiment, if the duty cycle of clock signal CLK at 102 is smaller than the duty cycle of inverted clock signal bCLK at 104, the period of oscillating signal A at 118 grows longer than the period of oscillating signal B at 120, and if the duty cycle of clock signal CLK at 102 is larger than the duty cycle of inverted clock signal bCLK at 104, the period of oscillating signal B at 120 grows longer than the period of oscillating signal A at 118.

Phase detector circuit 116 receives oscillating signal A at 118 and oscillating signal B at 120 and detects a phase difference between oscillating signal A at 118 and oscillating signal B at 120. If the phase difference reaches a phase difference limit, phase detector circuit 116 indicates the duty cycle of clock signal CLK at 102. Phase detector circuit 116 indicates that the duty cycle is greater than 50% via output signal GTFIFTY at 106 and less than 50% via output signal LTFIFTY at 108. In one embodiment, phase detector circuit 116 receives an active enable signal EN at 110 and waits a viable number of clock cycles of clock signal CLK at 102 before indicating the duty cycle of clock signal clock at 102.

After phase detector circuit 116 indicates the duty cycle of clock signal CLK at 102, enable signal EN at 110 transitions to a low logic level, which disables oscillations in first ring oscillator 122 and second ring oscillator 142. Enable signal EN at 110 transitions to a high logic level to begin another duty cycle detection operation.

FIG. 4 is a diagram illustrating one embodiment of a delay element 170. Each of the delay elements 130a-130d and 150a-150d can employ delay element 170. Delay element 170 includes an n-channel metal oxide semiconductor (NMOS) transistor 172 and a capacitor 174. At 176, the gate of NMOS transistor 172 receives a clock signal, such as clock signal CLK at 102 or inverted clock signal bCLK at 104. One side of the drain-source path of NMOS transistor 172 is electrically coupled at 178 to an output of an inverter, such as one of the inverters 128a-128d or one of the inverters 148a-148d. The other side of the drain-source path of NMOS transistor 172 is electrically coupled to a reference, such as ground, at 180.

NMOS transistor 172 is turned on via the high phase of the clock signal to connect capacitor 174 to the output of the inverter. This introduces a delay at the output of the inverter and lengthens the period of the oscillating signal, such as oscillating signal A at 118 or oscillating signal B at 120. NMOS transistor 172 is turned off via the low phase of the clock signal to disconnect capacitor 174 from the output of the inverter.

Figure 5:
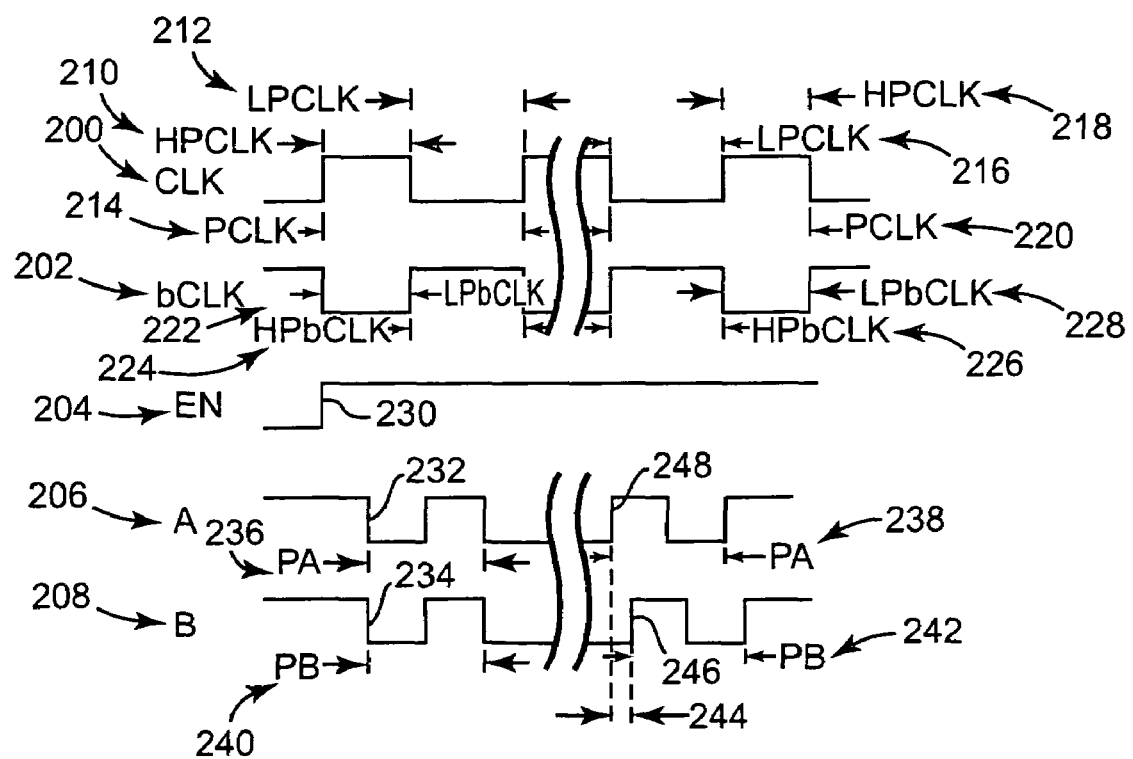
FIG. 5 is a timing diagram illustrating the operation of one embodiment of a duty cycle detector.

FIG. 5 is a timing diagram illustrating the operation of one embodiment of duty cycle detector 100 that includes delay elements 130a-130d and 150a-150d similar to delay element 170. Duty cycle detector 100 receives clock signal CLK at 200, inverted clock signal bCLK at 202, and enable signal EN at 204. First oscillator circuit 112 provides oscillating signal A at 206 and second oscillating circuit 114 provides oscillating signal B at 208.

Clock signal CLK at 200 oscillates at a clock frequency and has a high phase time HPCLK at 210 and a low phase time LPCLK at 212. Also, clock signal CLK at 200 has a clock period PCLK at 214 and a duty cycle that is equal to the high phase time HPCLK at 210 divided by the clock period PCLK at 214. Clock signal CLK at 200 continues oscillating at the same clock frequency and has low phase time LPCLK at 216, high phase time HPCLK at 218, and clock period PCLK at 220, which are substantially the same as low phase time LPCLK at 212, high phase time HPCLK at 210, and clock period PCLK at 214, respectively. In this example, the duty cycle of clock signal CLK at 200 is less than 50%.

Inverted clock signal bCLK at 202 is the inverse of clock signal CLK at 200 and oscillates at the same clock frequency as clock signal CLK at 200. Inverted clock signal bCLK at 202 has a low phase time LPbCLK at 222 and a high phase time HPbCLK at 224. Also, inverted clock signal bCLK at 202 has the same clock period PCLK at 214 as clock signal CLK at 200 and a duty cycle that is equal to the high phase time HPbCLK at 224 divided by the clock period PCLK at 214. Inverted clock signal bCLK at 202 continues oscillating at the same clock frequency and has high phase time HPbCLK at 226, low phase time LPbCLK at 228, and clock period PCLK at 220, which are the same as high phase time HPbCLK at 224, low phase time LPbCLK at 222, and clock period PCLK at 214, respectively. In this example, the duty cycle of inverted clock signal bCLK at 202 is greater than 50%.

Enable signal EN at 204 is initially at a low logic level and NAND gates 126 and 146 provide high logic level output signals. Also, fourth inverter 128*d* provides a high logic level output signal in oscillating signal A at 206 to the input of NAND gate 126 and eighth inverter 148*d* provides a high logic level output signal in oscillating signal B at 208 to the input of NAND gate 146. As enable signal EN at 204 transitions to a high logic level at 230, NAND gates 126 and 146 provide low logic level output signals. Also, fourth inverter 128*d* provides a low logic level at 232 in oscillating signal A at 206 to the input of NAND gate 126 and eighth inverter 148*d* provides a low logic level at 234 in oscillating signal B at 208 to the input of NAND gate 146. First ring oscillator 122 provides an oscillating signal in oscillating signal A at 206 to phase detector 116 and second ring oscillator 142 provides an oscillating signal in oscillating signal B at 208 to phase detector 116. Oscillating signal A at 206 has an average period PA at 236 and 238 and oscillating signal B has an average period PB at 240 and 242.

Delay circuit 124 provides delays in the inverter signal path of inverters 128*a*-128*d* based on the duty cycle of clock signal CLK at 200 and delay circuit 144 provides delays in the inverter signal path of inverters 148*a*-148*d* based on the duty cycle of inverted clock signal bCLK at 202. Delays from delay elements 130*a*-130*d* increase the average period PA at 236 and 238 of oscillating signal A at 206 and delays from delay elements 150*a*-150*d* increase the average period PB at 240 and 242 of oscillating signal B at 208. Delays from delay elements 130*a*-130*d* are switched into first ring oscillator 122 via the high phase of clock signal CLK at 200 and switched out during the low phase of clock signal CLK at 200, and delays from delay elements 150*a*-150*d* are switched into second ring oscillator 142 via the high phase of inverted clock signal bCLK at 202 and switched out during the low phase of inverted clock signal bCLK at 202. Since, the duty cycle of clock signal CLK at 200 is smaller than the duty cycle of inverted clock signal bCLK at 202, the average period PA at 236 and 238 of oscillating signal A at 206 is slightly shorter than the average period PB at 240 and 242 of oscillating signal B at 208.

Over time, the phase difference at 244 between oscillating signal A at 206 and oscillating signal B at 208 increases to reach a phase difference limit. Phase detector circuit 116 receives oscillating signal A at 206 and oscillating signal B at 208 and detects the phase difference at 244. If the phase difference at 244 is greater than or equal to the phase difference limit, phase detector circuit 116 indicates the duty cycle of clock signal CLK at 200. In this example, the rising edge at 246 of oscillating signal B at 208 lags the rising edge at 248 of oscillating signal A at 206 and phase detector circuit 116 indicates that the duty cycle of clock signal CLK at 200 is less than 50% via output signal LTFIFTY at 108. In other examples, the rising edge of oscillating signal B at 208 may lead the rising edge of oscillating signal A at 206 and phase detector circuit 116 indicates that the duty cycle of clock signal CLK at 200 is greater than 50% via output signal GTFIFTY at 106. In one embodiment, phase detector circuit 116 receives a high logic level at 230 in enable signal EN at 204 and waits a viable number of clock cycles of clock signal CLK at 200 before attempting to indicate the duty cycle of clock signal clock at 200.

After phase detector circuit 116 indicates the duty cycle of clock signal CLK at 200, enable signal EN at 204 transitions to a low logic level, which disables oscillations in first ring oscillator 122 and second ring oscillator 142. Enable signal EN at 204 transitions to a high logic level to begin another duty cycle detection operation.

Figure 6:
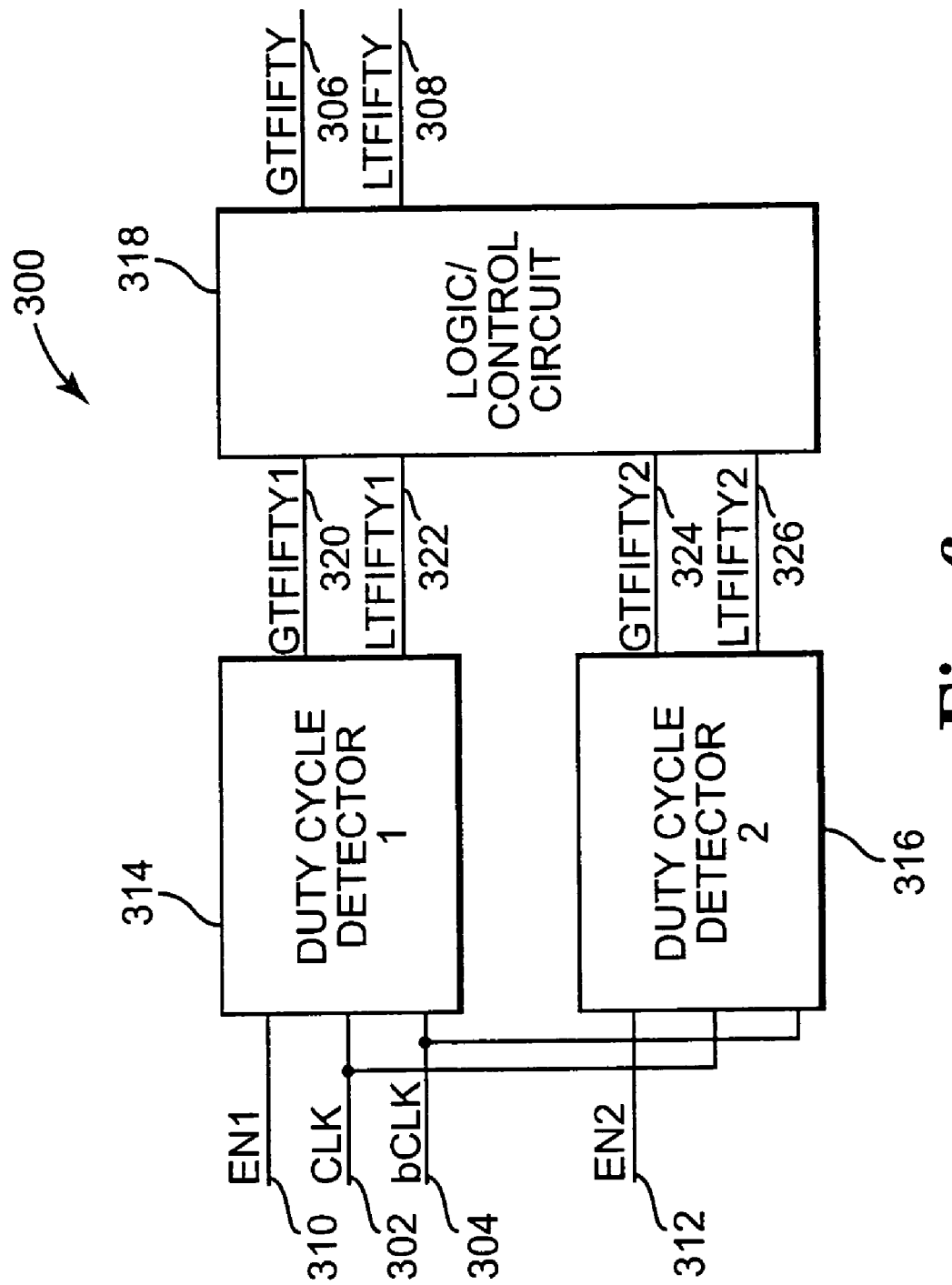
FIG. 6 is a diagram illustrating another embodiment of a duty cycle detector.

FIG. 6 is a diagram illustrating another embodiment of a duty cycle detector 300. Duty cycle detector 300 receives clock signal CLK at 302 and inverted clock signal bCLK at 304 and provides output signals GTFIFTY at 306 and LTFIFTY at 308. Also, duty cycle detector 300 receives enable signal one EN1 at 310 and enable signal two EN2 at 312. Duty cycle detector 300 is similar to duty cycle detector 40. Also, clock signal CLK at 302 and inverted clock signal bCLK at 304 are similar to clock signal CLK at 42 and inverted clock signal bCLK at 44, respectively. In addition, output signals GTFIFTY at 306 and LTFIFTY at 308 are similar to output signals GTFIFTY at 46 and LTFIFTY at 48, respectively.

Inverted clock signal bCLK at 304 is the inverse of clock signal CLK at 302. The duty cycle of clock signal CLK at 302 is the high level phase time of clock signal CLK at 302 divided by the period of clock signal CLK at 302. The duty cycle of inverted clock signal bCLK at 304 is the high level phase time of inverted clock signal bCLK at 304 divided by the period of the inverted clock signal bCLK at 304. Clock signal CLK at 302 and inverted clock signal bCLK at 304 are provided via any suitable clock circuit.

Output signal GTFIFTY at 306 indicates that the duty cycle of clock signal CLK at 302 is greater than 50% and output signal LTFIFTY at 308 indicates that the duty cycle of clock signal CLK at 302 is less than 50%. Enable signal one EN1 at 310 is activated at one edge, such as a rising edge, of clock signal CLK at 302 to begin detecting the duty cycle of clock signal CLK at 302 and enable signal two EN2 at 312 is activated at the other edge, such as a falling edge, of clock signal CLK at 302 to begin detecting the duty cycle of clock signal CLK at 302.

Duty cycle detector 300 includes a first duty cycle detector 314, a second duty cycle detector 316, and a logic/control circuit 318. First duty cycle detector 314 is electrically coupled to logic/control circuit 318 via communications paths 320 and 322. Second duty cycle detector 316 is electrically coupled to logic/control circuit 318 via communications paths 324 and 326. First duty cycle detector 314 receives clock signal CLK at 302, inverted clock signal bCLK at 304, and enable signal one EN1 at 310, and first duty cycle detector 314 provides output signal GTFIFTY1 at 320 to logic/control circuit 318 via communications path 320 and output signal LTFIFTY1 at 322 to logic/control circuit 318 via communications path 322. Second duty cycle detector 318 receives clock signal CLK at 302, inverted clock signal bCLK at 304, and enable signal two EN2 at 312. Second duty cycle detector 318 provides output signal GTFIFTY2 at 324 to logic/control circuit 318 via communications path 324 and output signal LTFIFTY2 at 326 to logic/control circuit 318 via communications path 326. Each of the first and second duty cycle detectors 314 and 316 is similar to duty cycle detector 100.

First duty cycle detector 314 receives clock signal CLK at 302, inverted clock signal bCLK at 304, and enable signal one EN1 at 310. First duty cycle detector 314 is similar to duty cycle detector 100 and provides one oscillating signal that has an oscillation period proportional to the duty cycle of clock signal CLK at 302 and another oscillating signal that has an oscillation period proportional to the duty cycle of inverted clock signal bCLK at 304. First duty cycle detector 314 detects the phase difference between the two oscillating signals. If the phase difference reaches a phase difference limit, first duty cycle detector 314 provides a signal to indicate the duty cycle of clock signal CLK at 302. First duty cycle detector 314 indicates the duty cycle of clock signal CLK at 302 is greater than 50% via output signal GTFIFTY1 at 320. First duty cycle detector 314 indicates the duty cycle of clock signal CLK at 302 is less than 50% via output signal LTFIFTY1 at 322.

Second duty cycle detector 316 receives clock signal CLK at 302, inverted clock signal bCLK at 304, and enable signal two EN2 at 312. Second duty cycle detector 316 is similar to duty cycle detector 100 and provides one oscillating signal that has an oscillation period proportional to the duty cycle of clock signal CLK at 302 and another oscillating signal that has an oscillation period proportional to the duty cycle of inverted clock signal bCLK at 304. Second duty cycle detector 316 detects the phase difference between the two oscillating signals. If the phase difference reaches a phase difference limit, second duty cycle detector 316 provides a signal to indicate the duty cycle of clock signal CLK at 302. Second duty cycle detector 316 indicates the duty cycle of clock signal CLK at 302 is greater than 50% via output signal GTFIFTY2 at 324. Second duty cycle detector 316 indicates the duty cycle of clock signal CLK at 302 is less than 50% via output signal LTFIFTY2 at 326.

First duty cycle detector 314 begins detecting the duty cycle of clock signal CLK at 302 at one edge, such as the rising edge, of clock signal CLK at 302. If enable signal one EN1 at 310 is activated at the rising edge of clock signal CLK at 302 and the delay elements in first duty cycle detector 314 are similar to delay element 170, the period of the oscillating signal proportional to the duty cycle of clock signal CLK at 302 in first duty cycle detector 314 is initially slightly longer than the period of the oscillating signal proportional to the duty cycle of inverted clock signal bCLK at 304 in first duty cycle detector 314. This is due to the first high phase being in clock signal CLK at 302 as opposed to being in inverted clock signal bCLK at 304.

Second duty cycle detector 316 begins detecting the duty cycle of clock signal CLK at 302 at another edge, such as the falling edge, of clock signal CLK at 302. If enable signal two EN2 at 312 is activated at the falling edge of clock signal CLK at 302 and the delay elements in second duty cycle detector 316 are similar to delay element 170, the period of the oscillating signal proportional to the duty cycle of inverted clock signal bCLK at 304 in second duty cycle detector 316 is initially slightly longer than the period of the oscillating signal proportional to the duty cycle of clock signal CLK at 302 in second duty cycle detector 316. This is due to the first high phase being in inverted clock signal bCLK at 304 as opposed to being in clock signal CLK at 302.

Logic/control circuit 318 receives output signals GTFIFTY1 at 320 and LTFIFTY1 at 322 and output signals GTFIFTY2 at 324 and LTFIFTY2 at 326. If both GTFIFTY1 at 320 and GTFIFTY2 at 324 indicate that the duty cycle of clock signal CLK at 302 is greater than 50%, logic/control circuit 318 indicates that the duty cycle of clock signal CLK at 302 is greater than 50% via output signal GTFIFTY at 306. If both LTFIFTY1 at 322 and LTFIFTY2 at 326 indicate that the duty cycle of clock signal CLK at 302 is less than 50%, logic/control circuit 318 indicates that the duty cycle of clock signal CLK at 302 is less than 50% via output signal LTFIFTY at 308. Logic/control circuit 318 indicates the duty cycle of clock signal CLK at 302 if first duty cycle detector 314 and second duty cycle detector 316 indicate a similar duty cycle result. This reduces or eliminates biases from the initial longer period of one of the two oscillating signals in first and second duty cycle detectors 314 and 316 due to activating enable signals EN1 and EN2 at 310 and 312 at different edges of clock signal CLK at 302.

In operation, clock signal CLK at 302 provides an oscillating clock signal that has a duty cycle, which is the high phase of clock signal CLK at 302 divided by the period of clock signal CLK at 302. Inverted clock signal bCLK at 304 is the inverse of clock signal CLK at 302. The duty cycle of inverted clock signal bCLK at 304 is the high phase of inverted clock signal bCLK at 304, i.e., the low phase of clock signal CLK at 302, divided by the period of inverted clock signal bCLk at 304, i.e., the period of clock signal CLK at 302. The duty cycle of clock signal CLK at 302 plus the duty cycle of inverted clock signal bCLK at 304 is equal to 100%.

Enable signal one EN1 at 310 transitions to an active high logic level at the rising edge of clock signal CLK at 302. First duty cycle detector 314 begins to detect the phase difference between the two oscillating signals in first duty cycle detector 314. At the next falling edge of clock signal CLK at 302, enable signal two EN2 at 312 transitions to an active high logic level. Second duty cycle detector 316 begins to detect the phase difference between the two oscillating signals in second duty cycle detector 314.

If the phase difference in first duty cycle detector 314 reaches a phase difference limit, first duty cycle detector 314 provides a signal to indicate the duty cycle of clock signal CLK at 302. First duty cycle detector 314 indicates the duty cycle of clock signal CLK at 302 is greater than 50% via output signal GTFIFTY1 at 320. First duty cycle detector 314 indicates the duty cycle of clock signal CLK at 302 is less than 50% via output signal LTFIFTY1 at 322. In one embodiment, first duty cycle detector 314 waits a viable number of clock cycles of clock signal CLK at 302 prior to attempting to provide a duty cycle signal.

If the phase difference in second duty cycle detector 316 reaches a phase difference limit, second duty cycle detector 316 provides a signal to indicate the duty cycle of clock signal CLK at 302. Second duty cycle detector 316 indicates the duty cycle of clock signal CLK at 302 is greater than 50% via output signal GTFIFTY2 at 324. Second duty cycle detector 316 indicates the duty cycle of clock signal CLK at 302 is less than 50% via output signal LTFIFTY2 at 326. In one embodiment, second duty cycle detector 316 waits a viable number of clock cycles of clock signal CLK at 302 prior to attempting to provide a duty cycle signal.

Logic/control circuit 318 receives output signals GTFIFTY1 at 320 and LTFIFTY1 at 322 and output signals GTFIFTY2 at 324 and LTFIFTY2 at 326. If both GTFIFTY1 at 320 and GTFIFTY2 at 324 indicate that the duty cycle of clock signal CLK at 302 is greater than 50%, logic/control circuit 318 indicates that the duty cycle of clock signal CLK at 302 is greater than 50% via output signal GTFIFTY at 306. If both LTFIFTY1 at 322 and LTFIFTY2 at 326 indicate that the duty cycle of clock signal CLK at 302 is less than 50%, logic/control circuit 318 indicates that the duty cycle of clock signal CLK at 302 is less than 50% via output signal LTFIFTY at 308.

Duty cycle detector 100 and duty cycle detector 300 detect the duty cycle of a clock signal, such as clock signal CLK at 302. The result can be used to provide an internal clock signal that has substantially a 50% duty cycle. Also, duty cycle detector 100 and duty cycle detector 300 are not difficult to build or complex in design. In addition, these duty cycle detectors can be disabled to save power via enable signals, such as enable signal EN at 110 and enable signals EN1 and EN2 at 310 and 312.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit, comprising:
   a first circuit configured to receive a clock signal having a first duty cycle and to provide a first oscillating signal having a first period that is adjusted based on the first duty cycle;
   a second circuit configured to receive an inverted clock signal that is the inverse of the clock signal and having a second duty cycle and to provide a second oscillating signal having a second period that is adjusted based on the second duty cycle; and
   a third circuit configured to provide first output signals that indicate the first duty cycle of the clock signal based on a first phase difference between the first oscillating signal and the second oscillating signal.

2. The integrated circuit of claim 1, wherein the third circuit is configured to provide the first output signals in response to the first phase difference reaching a phase difference limit.

3. The integrated circuit of claim 2, wherein the third circuit is configured to provide the first output signals after a viable number of cycles of the clock signal.

4. The integrated circuit of claim 1, comprising:
   a fourth circuit configured to receive the clock signal having the first duty cycle and to provide a third oscillating signal having a third period proportional to the first duty cycle;
   a fifth circuit configured to receive the inverted clock signal having the second duty cycle and to provide a fourth oscillating signal having a fourth period proportional to the second duty cycle;
   a sixth circuit configured to provide second output signals that indicate the first duty cycle of the clock signal based on a second phase difference between the third oscillating signal and the fourth oscillating signal; and
   a seventh circuit configured to provide third output signals that indicate the first duty cycle of the clock signal based on the first output signals and the second output signals.

5. The integrated circuit of claim 4, wherein the first circuit is configured to receive a first enable signal and provide the first oscillating signal in response to an active first enable signal and the second circuit is configured to receive the first enable signal and provide the second oscillating signal in response to the active first enable signal and the third circuit is configured to receive a second enable signal and provide the third oscillating signal in response to an active second enable signal and the fourth circuit is configured to receive the second enable signal and provide the fourth oscillating signal in response to the active second enable signal.

6. An integrated circuit, comprising:
   a first circuit configured to receive a clock signal having a first duty cycle and to provide a first oscillating signal having a first period proportional to the first duty cycle;
   a second circuit configured to receive an inverted clock signal that is the inverse of the clock signal and having a second duty cycle and to provide a second oscillating signal having a second period proportional to the second duty cycle; and
   a third circuit configured to provide first output signals that indicate the first duty cycle of the clock signal based on a first phase difference between the first oscillating signal and the second oscillating signal, wherein the first circuit is configured to receive an enable signal and provide the first oscillating signal in response to an active enable signal and the second circuit is configured to receive the enable signal and provide the second oscillating signal in response to the active enable signal.

7. An integrated circuit, comprising:
   a first ring oscillator configured to provide a first periodic signal;
   a first delay circuit configured to receive a clock signal having a first duty cycle and provide first delays in the first ring oscillator based on the first duty cycle;
   a second ring oscillator configured to provide a second periodic signal;
   a second delay circuit configured to receive an inverted clock signal that is the inverse of the clock signal and having a second duty cycle and provide second delays in the second ring oscillator based on the second duty cycle; and
   a phase detector configured to provide output signals that indicate one of the first duty cycle is greater than fifty percent and the first duty cycle is less than fifty percent based on a phase difference between the first periodic signal and the second periodic signal.

8. The integrated circuit of claim 7, wherein the first delay circuit comprises first capacitors that are switched into the first ring oscillator via the clock signal and the second delay circuit comprises second capacitors that are switched into the second ring oscillator via the inverted clock signal.

9. The integrated circuit of claim 7, wherein the first ring oscillator is configured to receive an enable signal that is active at one of a rising edge and a falling edge of the clock signal and provide the first periodic signal in response to the active enable signal and the second ring oscillator is configured to receive the enable signal and provide the second periodic signal in response to the active enable signal.

10. The integrated circuit of claim 7, wherein the phase detector is configured to provide the output signals in response to the phase difference reaching a phase difference limit.

11. The integrated circuit of claim 7, wherein the phase detector is configured to provide the output signals after a viable number of cycles of the clock signal.

12. The integrated circuit of claim 7, wherein the first delay circuit is configured to receive the inverted clock signal and provide third delays in the first ring oscillator based on the second duty cycle and the second delay circuit is configured to receive the clock signal and provide fourth delays in the second ring oscillator based on the first duty cycle.

13. An integrated circuit, comprising:
a first ring oscillator including first inverters having a first inverter signal path configured to provide a first periodic signal;
a first delay circuit configured to receive a clock signal having a first duty cycle and including first capacitors configured to be switched into the first inverter signal path via the clock signal to provide first delays in the first inverter signal path based on the first duty cycle;
a second ring oscillator including second inverters having a second inverter signal path configured to provide a second periodic signal;
a second delay circuit configured to receive an inverted clock signal that is the inverse of the clock signal and having a second duty cycle and including second capacitors configured to be switched into the second inverter signal path via the inverted clock signal to provide second delays in the second inverter signal path based on the second duty cycle; and
a first phase detector configured to provide first output signals that indicate one of the first duty cycle is greater than fifty percent and the first duty cycle is less than fifty percent based on a first phase difference between the first periodic signal and the second periodic signal, wherein the first ring oscillator is configured to receive a first enable signal that is active at one of a rising edge and a falling edge of the clock signal and provide the first periodic signal in response to the active first enable signal and the second ring oscillator is configured to receive the first enable signal and provide the second periodic signal in response to the active first enable signal.

14. The integrated circuit of claim 13, comprising:
a third ring oscillator including third inverters having a third inverter signal path configured to provide a third periodic signal;
a third delay circuit configured to receive the clock signal having the first duty cycle and including third capacitors configured to be switched into the third inverter signal path via the clock signal to provide third delays in the third inverter signal path based on the first duty cycle;
a fourth ring oscillator including fourth inverters having a fourth inverter signal path configured to provide a fourth periodic signal;
a fourth delay circuit configured to receive the inverted clock signal having the second duty cycle and including fourth capacitors configured to be switched into the fourth inverter signal path via the inverted clock signal to provide fourth delays in the fourth inverter signal path based on the second duty cycle; and
a second phase detector configured to provide second output signals that indicate one of the first duty cycle is greater than fifty percent and the first duty cycle is less than fifty percent based on a second phase difference between the third periodic signal and the fourth periodic signal, wherein the third ring oscillator is configured to receive a second enable signal that is active at the other one of the rising edge and the falling edge of the clock signal and provide the third periodic signal in response to the active second enable signal and the fourth ring oscillator is configured to receive the second enable signal and provide the fourth periodic signal in response to the active second enable signal.

15. The integrated circuit of claim 14, comprising:
a control circuit configured to receive the first output signals and the second output signals and provide a duty cycle result that indicates the first duty cycle based on the first output signals and the second output signals.

16. The integrated circuit of claim 15, wherein the control circuit provides the duty cycle result a viable number of cycles of the clock signal after at least one of the active first enable signal and the active second enable signal.

17. An integrated circuit, comprising:
means for receiving a clock signal having a first duty cycle;
means for adjusting a first period of a first oscillating signal based on the first duty cycle;
means for receiving an inverted clock signal that is the inverse of the clock signal and has a second duty cycle;
means for adjusting a second period of a second oscillating signal based on the second duty cycle; and
means for indicating the first duty cycle in first output signals based on a first phase difference between the first oscillating signal and the second oscillating signal.

18. The integrated circuit of claim 17, wherein the means for indicating comprises:
means for indicating the first duty cycle in response to the first phase difference reaching a phase difference limit.

19. The integrated circuit of claim 18, wherein the means for indicating comprises:
means for indicating the first duty cycle after a viable number of cycles of the clock signal.

20. An integrated circuit, comprising:
means for receiving a clock signal having a first duty cycle;
means for proportioning a first period of a first oscillating signal to the first duty cycle;
means for receiving an inverted clock signal that is the inverse of the clock signal and has a second duty cycle;
means for proportioning a second period of a second oscillating signal to the second duty cycle;
means for indicating the first duty cycle in first output signals based on a first phase difference between the first oscillating signal and the second oscillating signal;
means for proportioning a third period of a third oscillating signal to the first duty cycle;
means for proportioning a fourth period of a fourth oscillating signal to the second duty cycle;
means for indicating the first duty cycle in second output signals based on a second phase difference between the third oscillating signal and the fourth oscillating signal; and
means for indicating the first duty cycle based on the first output signals and the second output signals.

21. The integrated circuit of claim 20, comprising:
means for receiving a first enable signal to provide the first oscillating signal and the second oscillating signal in response to an active first enable signal; and
means for receiving a second enable signal to provide the third oscillating signal and the fourth oscillating signal in response to an active second enable signal.

22. A method of operating an integrated circuit, comprising:
receiving a clock signal having a first duty cycle;
adjusting a first period of a first oscillating signal based on the first duty cycle;
receiving an inverted clock signal that is the inverse of the clock signal and has a second duty cycle;
adjusting a second period of a second oscillating signal based on the second duty cycle; and
indicating the first duty cycle in first output signals based on a first phase difference between the first oscillating signal and the second oscillating signal.

23. The method of claim 22, wherein indicating the first duty cycle, comprises:

indicating the first duty cycle in response to the first phase difference reaching a phase difference limit.

24. The method of claim 23, wherein indicating the first duty cycle, comprises:
indicating the first duty cycle after a viable number of cycles of the clock signal.

25. A method of operating an integrated circuit, comprising:
receiving a clock signal having a first duty cycle;
proportioning a first period of a first oscillating signal to the first duty cycle;
receiving an inverted clock signal that is the inverse of the clock signal and has a second duty cycle;
proportioning a second period of a second oscillating signal to the second duty cycle;
indicating the first duty cycle in first output signals based on a first phase difference between the first oscillating signal and the second oscillating signal;
proportioning a third period of a third oscillating signal to the first duty cycle;
proportioning a fourth period of a fourth oscillating signal to the second duty cycle;
indicating the first duty cycle in second output signals based on a second phase difference between the third oscillating signal and the fourth oscillating signal; and
indicating the first duty cycle based on the first output signals and the second output signals.

26. The method of claim 25, comprising:
receiving a first enable signal to provide the first oscillating signal and the second oscillating signal in response to an active first enable signal; and
receiving a second enable signal to provide the third oscillating signal and the fourth oscillating signal in response to an active second enable signal.

27. A method of operating an integrated circuit, comprising:
providing a first periodic signal via a first ring oscillator;
receiving a clock signal having a first duty cycle;
switching first delays into the first ring oscillator based on the first duty cycle;
providing a second periodic signal via a second ring oscillator;
receiving an inverted clock signal that is the inverse of the clock signal and having a second duty cycle;
switching second delays into the second ring oscillator based on the second duty cycle; and
indicating one of the first duty cycle is greater than fifty percent and the first duty cycle is less than fifty percent based on a phase difference between the first periodic signal and the second periodic signal.

28. The method of claim 27, comprising:
receiving an enable signal that is active at one of a rising edge and a falling edge of the clock signal at the first ring oscillator;
receiving the enable signal at the second ring oscillator; and
providing the first periodic signal and the second periodic signal in response to the active enable signal.

29. The method of claim 27, comprising:
switching third delays into the first ring oscillator based on the second duty cycle; and
switching fourth delays into the second ring oscillator based on the first duty cycle.

30. A method of operating an integrated circuit, comprising:
providing a first periodic signal via first inverters having a first inverter signal path configured to provide the first periodic signal;
receiving a clock signal having a first duty cycle;
switching first capacitors into the first inverter signal path via the clock signal to provide first delays in the first inverter signal path based on the first duty cycle;
providing a second periodic signal via second inverters having a second inverter signal path configured to provide the second periodic signal;
receiving an inverted clock signal that is the inverse of the clock signal and having a second duty cycle;
switching second capacitors into the second inverter signal path via the inverted clock signal to provide second delays in the second inverter signal path based on the second duty cycle;
receiving a first enable signal that is active at one of a rising edge and a falling edge of the clock signal;
providing the first periodic signal and the second periodic signal in response to the active first enable signal; and
indicating in first output signal one of the first duty cycle is greater than fifty percent and the first duty cycle is less than fifty percent based on a first phase difference between the first periodic signal and the second periodic signal.

31. The method of claim 30, comprising:
providing a third periodic signal via third inverters having a third inverter signal path configured to provide the third periodic signal;
switching third capacitors into the third inverter signal path via the clock signal to provide third delays in the third inverter signal path based on the first duty cycle;
providing a fourth periodic signal via fourth inverters having a fourth inverter signal path configured to provide a fourth periodic signal;
switching fourth capacitors into the fourth inverter signal path via the inverted clock signal to provide fourth delays in the fourth inverter signal path based on the second duty cycle;
receiving a second enable signal that is active at the other one of the rising edge and the falling edge of the clock signal;
providing the third periodic signal and the fourth periodic signal in response to the active second enable signal; and
indicating in second output signals one of the first duty cycle is greater than fifty percent and the first duty cycle is less than fifty percent based on a second phase difference between the third periodic signal and the fourth periodic signal.

32. The method of claim 31, comprising:
receiving the first output signals and the second output signals; and
indicating in a duty cycle result the first duty cycle based on the first output signals and the second output signals.

33. The method of claim 32, wherein indicating in a duty cycle result comprises:
indicating the first duty cycle a number of cycles of the clock signal after at least one of the active first enable signal and the active second enable signal.

* * * * *